United States Patent
Siah

(10) Patent No.: US 10,224,338 B2
(45) Date of Patent: Mar. 5, 2019

(54) COST-EFFECTIVE METHOD TO FORM A RELIABLE MEMORY DEVICE WITH SELECTIVE SILICIDATION AND RESULTING DEVICE

(71) Applicant: GLOBALFOUNDRIES Singapore Pte. Ltd., Singapore (SG)

(72) Inventor: Soh Yun Siah, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/490,329

(22) Filed: Apr. 18, 2017

(65) Prior Publication Data

US 2018/0301464 A1 Oct. 18, 2018

(51) Int. Cl.
| | |
|---|---|
| H01L 27/11568 | (2017.01) |
| H01L 21/02 | (2006.01) |
| H01L 27/11521 | (2017.01) |
| H01L 21/3205 | (2006.01) |

(52) U.S. Cl.
CPC .... H01L 27/11568 (2013.01); H01L 21/0214 (2013.01); H01L 21/0217 (2013.01); H01L 21/02164 (2013.01); H01L 21/02532 (2013.01); H01L 21/02595 (2013.01); H01L 21/32053 (2013.01); H01L 27/11521 (2013.01)

(58) Field of Classification Search
CPC ......... H01L 27/11568; H01L 27/11521; H01L 21/02164; H01L 21/0217; H01L 21/02532; H01L 21/02595; H01L 21/0214; H01L 21/32053
See application file for complete search history.

(56) References Cited

U.S. PATENT DOCUMENTS

| | | | |
|---|---|---|---|
| 6,025,267 A | 2/2000 | Pey et al. | |
| 6,849,495 B2 | 2/2005 | Wensley et al. | |
| 9,111,866 B2 | 8/2015 | Chen et al. | |
| 2007/0099414 A1* | 5/2007 | Frohberg | H01L 21/76877 438/618 |
| 2013/0207174 A1* | 8/2013 | Wang | H01L 21/28273 257/316 |

* cited by examiner

*Primary Examiner* — Joseph C Nicely
*Assistant Examiner* — Pavel Ivanov
(74) *Attorney, Agent, or Firm* — Ditthavong & Steiner, P.C.

(57) ABSTRACT

A method of forming a memory device with a dielectric blocking layer and selective silicidation and the resulting device are provided. Embodiments include forming a memory stack on a substrate; forming a conformal insulating layer over sidewalls and an upper surface of the memory stack and the substrate; forming an interpoly dielectric structure adjacent to each sidewall of the insulating layer; forming a conformal polysilicon silicon layer over the insulating layer and interpoly dielectric structures; forming an optical planarization layer over the polysilicon layer; planarizing the optical planarization and polysilicon layers down to the memory stack; forming a dielectric blocking layer over the memory stack and substrate; forming a patterning stack over the dielectric blocking layer, the patterning stack covering a portion of the memory stack; and removing the dielectric blocking, optical planarization, and polysilicon layers on opposite sides of the patterning stack.

11 Claims, 7 Drawing Sheets

COST-EFFECTIVE METHOD TO FORM A RELIABLE MEMORY DEVICE WITH SELECTIVE SILICIDATION AND RESULTING DEVICE

TECHNICAL FIELD

The present disclosure relates to memory design for semiconductor devices. The present disclosure is particularly applicable to the formation of non-volatile memory (NVM) devices.

BACKGROUND

A known memory device is susceptible to interpoly dielectric breakdown and memory device dielectric breakdown damage during implantation steps. Also, additional masks are often required to prevent silicidation on the memory device, which can cause shorts between the memory device and an adjacent memory stack.

A need therefore exists for methodology enabling protection of a memory device during implantation and prevention of non-selective silicidation without additional masks and the resulting device.

SUMMARY

An aspect of the present disclosure is a method of forming a memory device with a dielectric blocking layer and selective silicidation.

Another aspect of the present disclosure is a memory device with a dielectric blocking layer and selective silicidation.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a memory stack on a substrate; forming a conformal insulating layer on sidewalls and on an upper surface of the memory stack and on an upper surface of the substrate; forming an interpoly dielectric adjacent to sidewalls of the insulating layer; forming a conformal polysilicon silicon layer over the insulating layer and interpoly dielectric structures; forming an optical planarization layer over the polysilicon layer; planarizing the optical planarization and polysilicon layers; forming a dielectric blocking layer over the memory stack and substrate; forming a patterning stack over the dielectric blocking layer, the patterning stack covering a portion of the memory stack; and removing the dielectric blocking, optical planarization, and polysilicon layers on opposite sides of the patterning stack.

Aspects of the present disclosure include forming the memory stack by: forming a first silicon oxide ($SiO_x$) layer over the substrate; forming a first polysilicon layer over the first $SiO_x$ layer; forming a dielectric layer over the first polysilicon layer; forming a second polysilicon layer over the dielectric layer; and forming a capping layer over the second polysilicon layer. Other aspects include forming the dielectric layer of $SiO_x$ or a composite layer of $SiO_x$/silicon nitride (SiN)/$SiO_x$ or $SiO_x$/silicon oxynitride (SiON)/$SiO_x$. Another aspect includes forming the conformal insulating layer of $SiO_x$, SiN, or a composite layer of $SiO_x$/SiN/$SiO_x$ or $SiO_x$/SiN. Additional aspects include forming the dielectric blocking layer of SiN, $SiO_x$, SiON, or a composite layer of combinations of any SiN, $SiO_x$, and SiON layers. Other aspects include forming the patterning stack with a width of 60 nanometer (nm) to 160 nm.

Another aspect of the present disclosure is a device including: a memory stack over a substrate; a conformal insulator layer on sidewalls of the memory stack and over the substrate; an interpoly dielectric structure adjacent to sidewalls of the insulating layer; a memory device over the insulator layer and adjacent to the interpoly dielectric structure; a dielectric blocking layer covering the memory device, a interpoly dielectric structure, and a portion of the insulating layer over an upper surface of the memory stack; and a silicide layer formed in a remaining portion of the upper surface of the memory stack.

Aspects of the device include the memory stack being formed of a first $SiO_x$ layer over the substrate; a first polysilicon layer over the first $SiO_x$ layer; a dielectric layer over the first polysilicon layer; a second polysilicon layer over the dielectric layer; a capping layer over the second polysilicon layer, forming the portion of the upper surface of the memory stack; and the silicide layer over the second polysilicon layer, adjacent to the capping layer. Other aspects include the dielectric layer being $SiO_x$ or a composite layer of $SiO_x$/SiN/$SiO_x$ or $SiO_x$/SiON/$SiO_x$. Another aspect includes the conformal insulating layer being $SiO_x$, SiN, or a composite layer of $SiO_x$/SiN/$SiO_x$ or SiOx/SiN. Additional aspects include the interpoly dielectric being $SiO_x$, SiN, or a composite layer of $SiO_x$/SiN/$SiO_x$ or $SiO_x$/polysilicon/$SiO_x$. Other aspects include the dielectric blocking layer being SiN, $SiO_x$, SiON, or a composite of combinations of any SiN, $SiO_x$, and SiON layers.

A further aspect of the present disclosure is a method including: forming a pair of memory stacks laterally separated on a substrate; forming a conformal insulating layer on sidewalls and on an upper surface of each memory stack and on the substrate; forming an interpoly dielectric structure adjacent to each sidewall of the insulating layer; forming a conformal polysilicon silicon layer over the substrate; forming an optical planarization layer over the polysilicon layer; planarizing the optical planarization and polysilicon layers; forming a dielectric blocking layer to a thickness of 50 angstrom (Å) to 1500 Å over the substrate; forming a pair of patterning stacks laterally separated on the dielectric blocking layer, each patterning stack covering an outer portion of a memory stack; and removing the dielectric blocking, optical planarization, and polysilicon layers on opposite sides of each patterning stack.

Aspects of the present disclosure include forming each memory stack by: forming a first $SiO_x$ layer over the substrate; forming a first polysilicon layer over the first $SiO_x$ layer; forming a dielectric layer over the first polysilicon layer; forming a second polysilicon layer over the dielectric layer; and forming a capping layer over the second polysilicon layer. Others aspects include forming the conformal insulating layer of $SiO_x$, SiN, or a composite layer of $SiO_x$/SiN/$SiO_x$ or SiOx/SiN. Further aspects include forming the interpoly dielectric of a layer of $SiO_x$, or a layer of SiN, or a composite layer of $SiO_x$/SiN/$SiO_x$ or a composite layer of $SiO_x$/polysilicon/$SiO_x$. Another aspect includes forming the dielectric blocking layer of SiN, or of $SiO_x$, or of SiON, or of a composite layer of a combination of two or three of SiN, $SiO_x$, and SiON layers.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1:
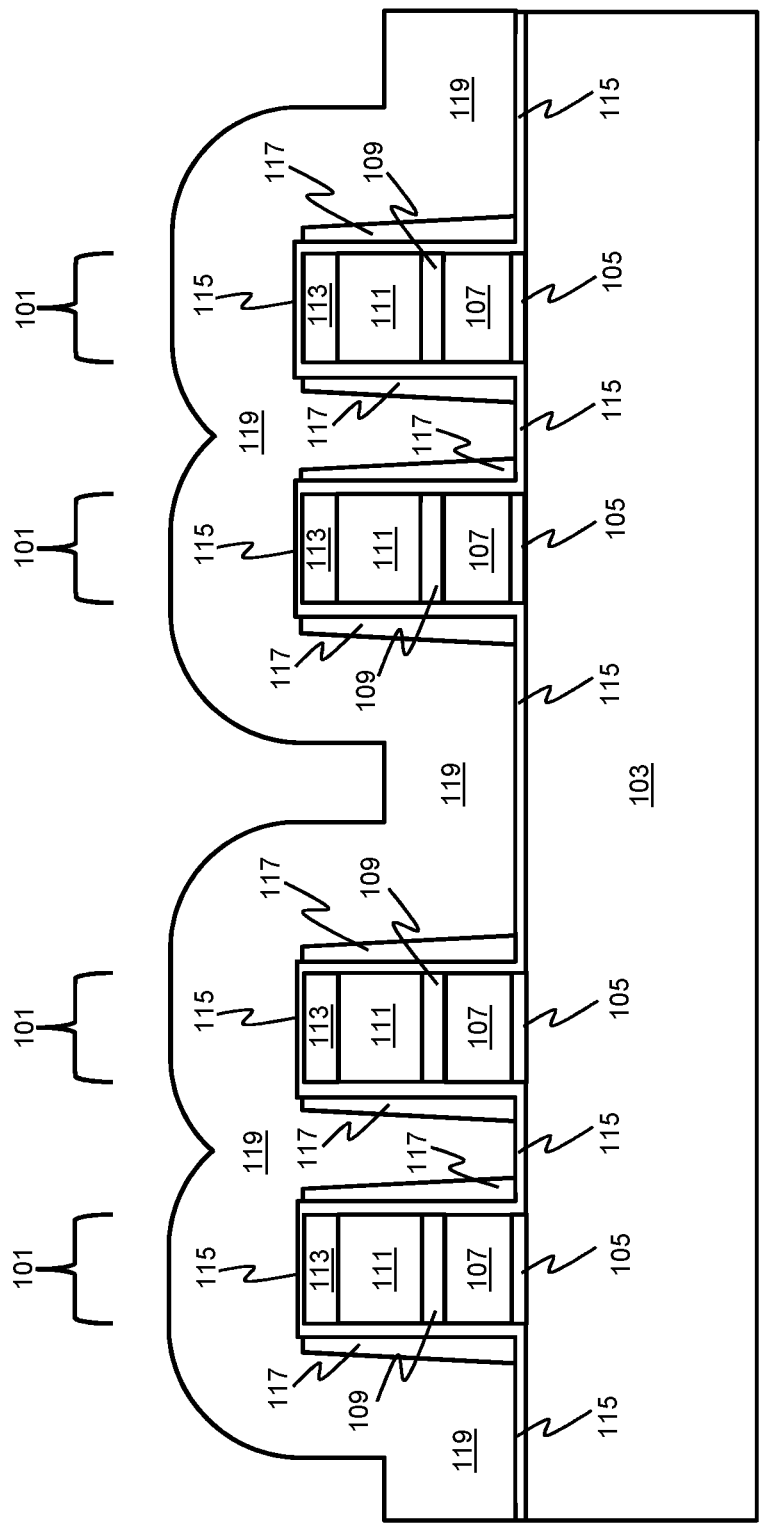
FIGS. 1 through 7 schematically illustrate cross-sectional views of a process flow for forming a memory device with a dielectric blocking layer and selective silicidation, in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of interpoly dielectric breakdown and memory device dielectric breakdown due to implantation steps, non-selective silicidation on a memory device causing electrical shorts, and uneven memory device and adjacent memory stack heights attendant upon forming a memory device. The problems are solved, inter alia, by forming a dielectric blocking layer over the memory device and an adjacent portion of an adjacent memory stack.

Methodology in accordance with embodiments of the present disclosure includes forming a memory stack on a substrate. A conformal insulating layer is formed over sidewalls and an upper surface of the memory stack and the substrate. An interpoly dielectric structure is formed adjacent to each sidewall of the insulating layer, and a conformal polysilicon silicon layer is formed over the insulating layer and interpoly dielectric structures. An optical planarization layer is formed over the polysilicon layer, and the optical planarization and polysilicon layers are planarized down to the memory stack. A dielectric blocking layer is formed over the memory stack and substrate. A patterning stack is formed over the dielectric blocking layer, the patterning stack covering a portion of the memory stack, and the dielectric blocking, optical planarization, and polysilicon layers are removed on opposite sides of the patterning stack.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects.

Accordingly, the drawings and description are to be regarded as illustrative in nature, and not as restrictive.

FIGS. 1 through 7 schematically illustrate cross-sectional views of a process flow for forming a memory device with a dielectric blocking layer and selective silicidation, in accordance with an exemplary embodiment. Adverting to FIG. 1, a memory stack 101 is formed, e.g., in one or more pairs, on a substrate 103. Each memory stack 101 is formed of a $SiO_x$ layer 105, a polysilicon layer 107, a dielectric layer 109, a polysilicon layer 111, and a capping layer 113. The polysilicon layers 107 and 111 each may be formed, e.g., to a thickness of 500 Å to 1500 Å, the dielectric layer 109 may be formed, e.g., of $SiO_x$ or a composite layer of $SiO_x$/SiN/$SiO_x$ or $SiO_x$/SiON/$SiO_x$, and the capping layer 113 may be formed to a thickness of 20 Å to 1000 Å. A conformal insulating layer 115 is then formed, e.g., of $SiO_x$, SiN, or a composite layer of $SiO_x$/SiN/SiOx or SiOx/SiN, over the sidewalls and the upper surface of each memory stack 101 and over the substrate 103. Next, interpoly dielectric structures 117 are formed, e.g., of $SiO_x$, SiN, or a composite layer of $SiO_x$/SiN/$SiO_x$ or $SiO_x$/polysilicon/$SiO_x$, adjacent to each sidewall of the insulating layer 115. Thereafter, a conformal polysilicon layer 119 is formed, e.g., to a thickness of 700 Å to 2500 Å, over the insulating layer 115 and the interpoly dielectric structures 117.

Figure 2:
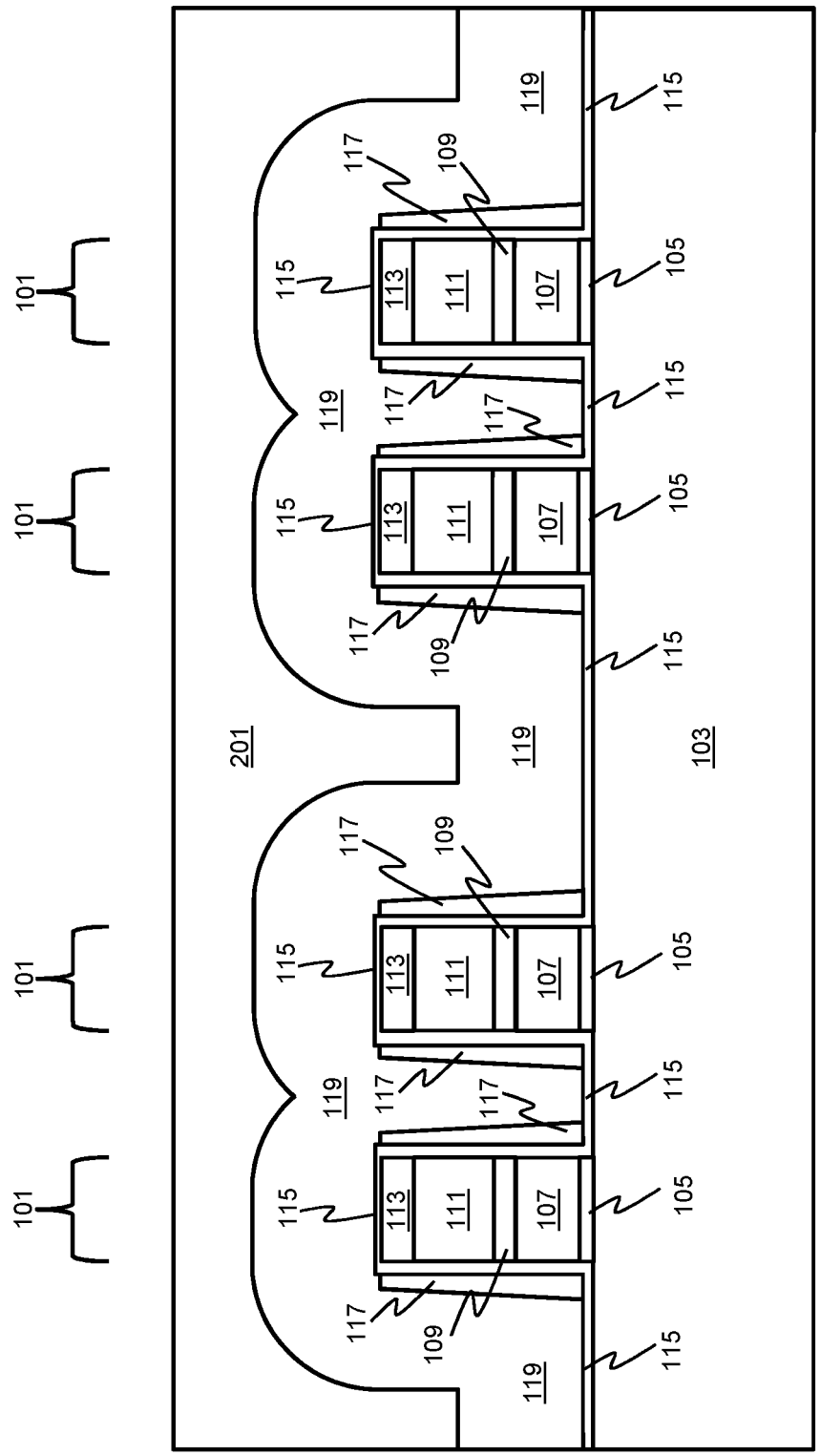
Figure 3:
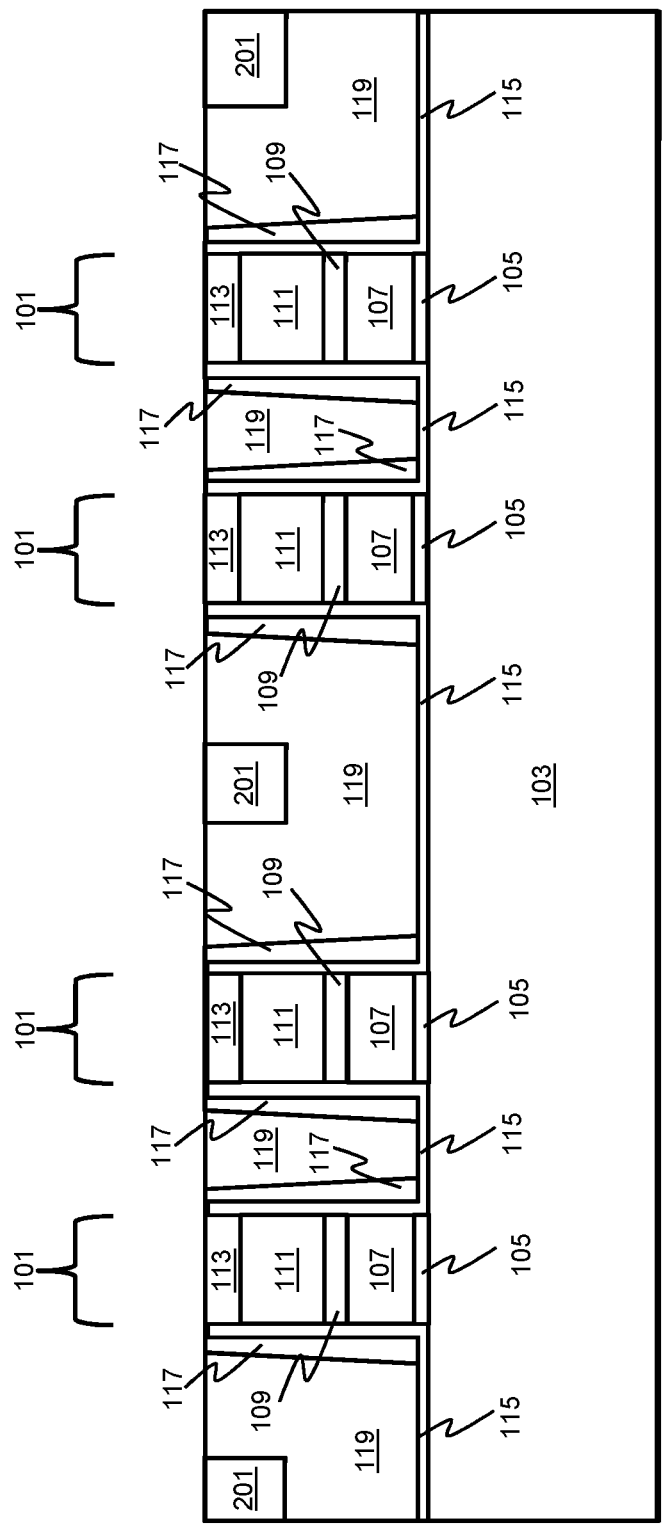
Figure 4:
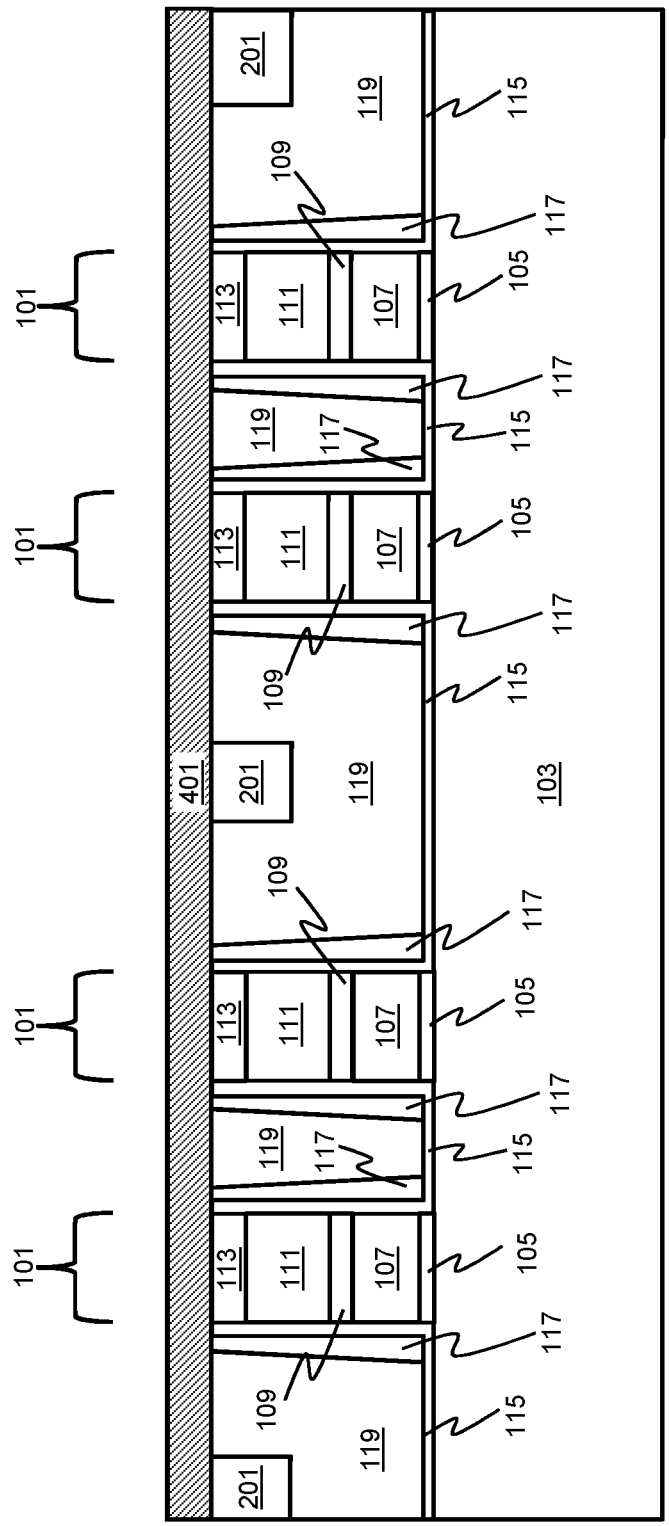

Adverting to FIG. 2, an optical planarization layer 201 is formed over the polysilicon layer 119. The optical planarization layer 201, the polysilicon layer 119, and the insulating layer 115 are then planarized, e.g., by a blanket etch or a poly chemical mechanical polishing (CMP), down to the memory stack 101, as depicted in FIG. 3. Adverting to FIG. 4, a dielectric blocking layer 401 is formed, e.g., of SiN, $SiO_x$, SiON, or a composite of combinations of any SiN, $SiO_x$, and SiON layers, over each memory stack 101 and the substrate 103. The dielectric blocking layer 401 may be formed, e.g., to a thickness of 50 Å to 1500 Å.

Figure 5:
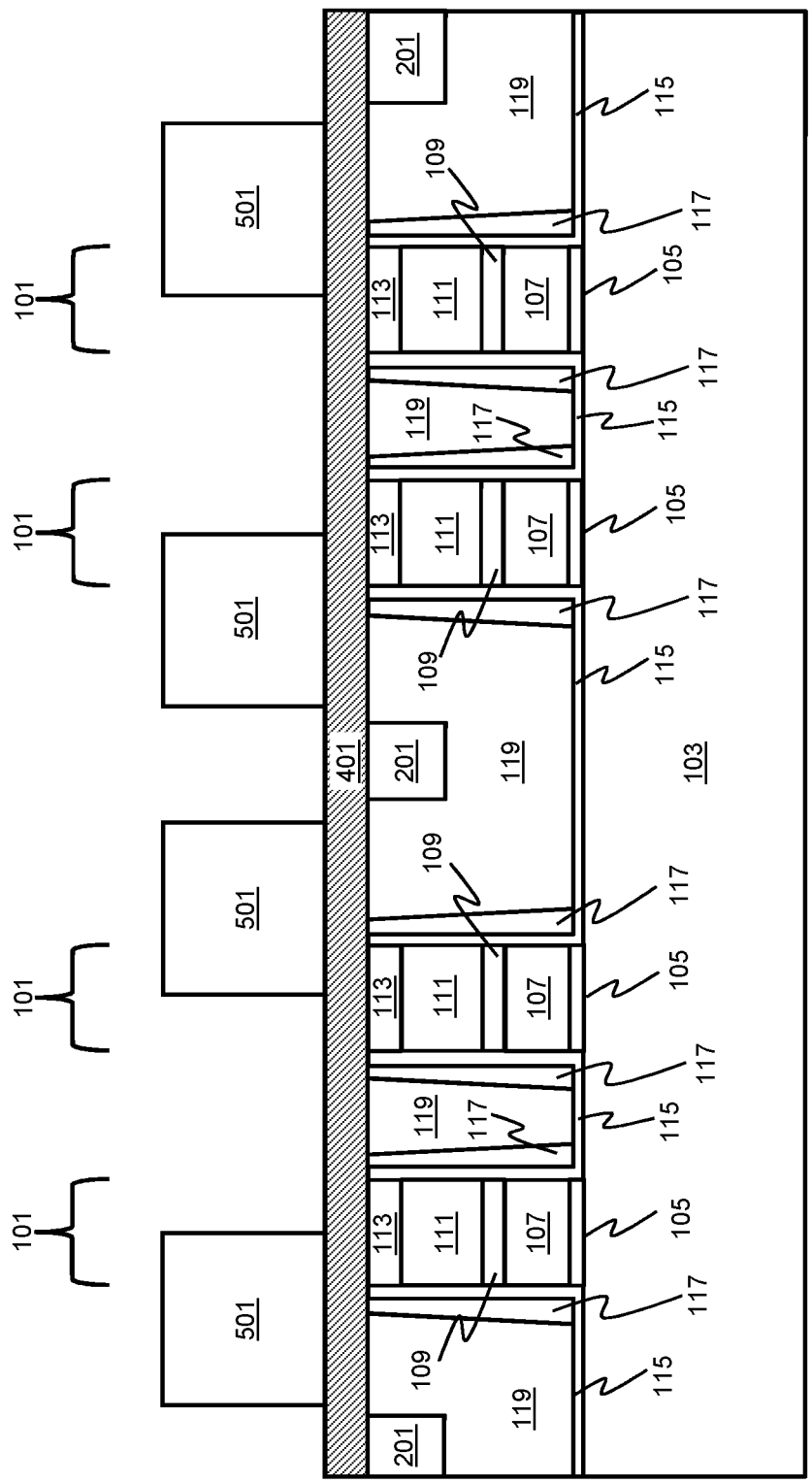
Figure 6:
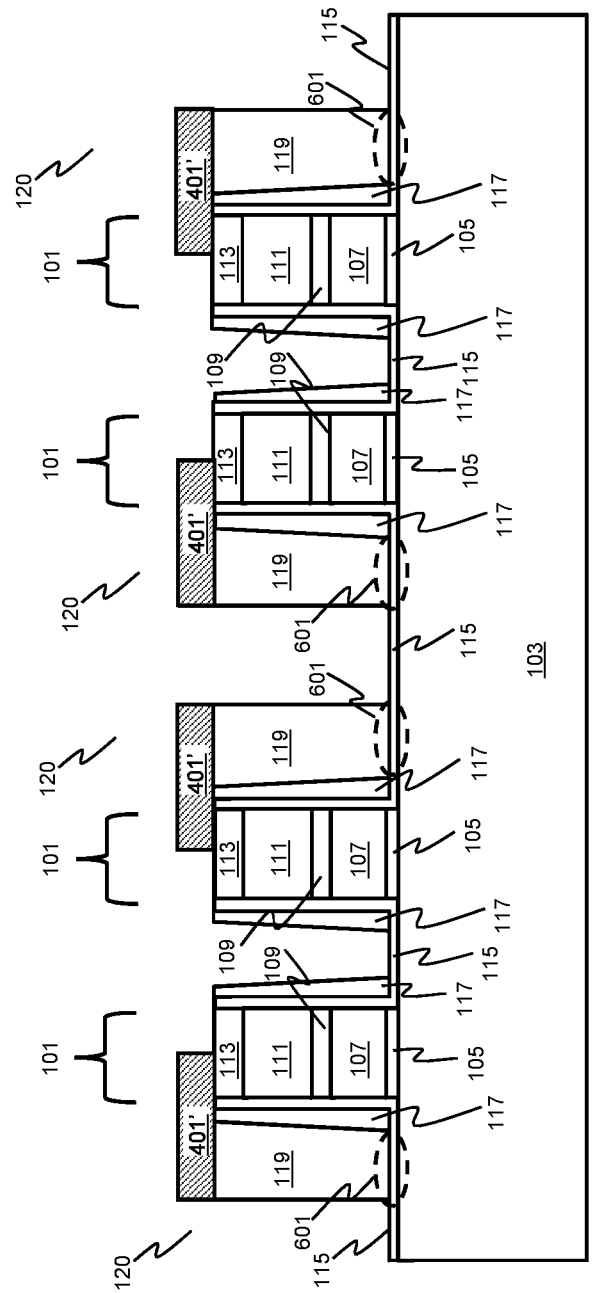
Figure 7:
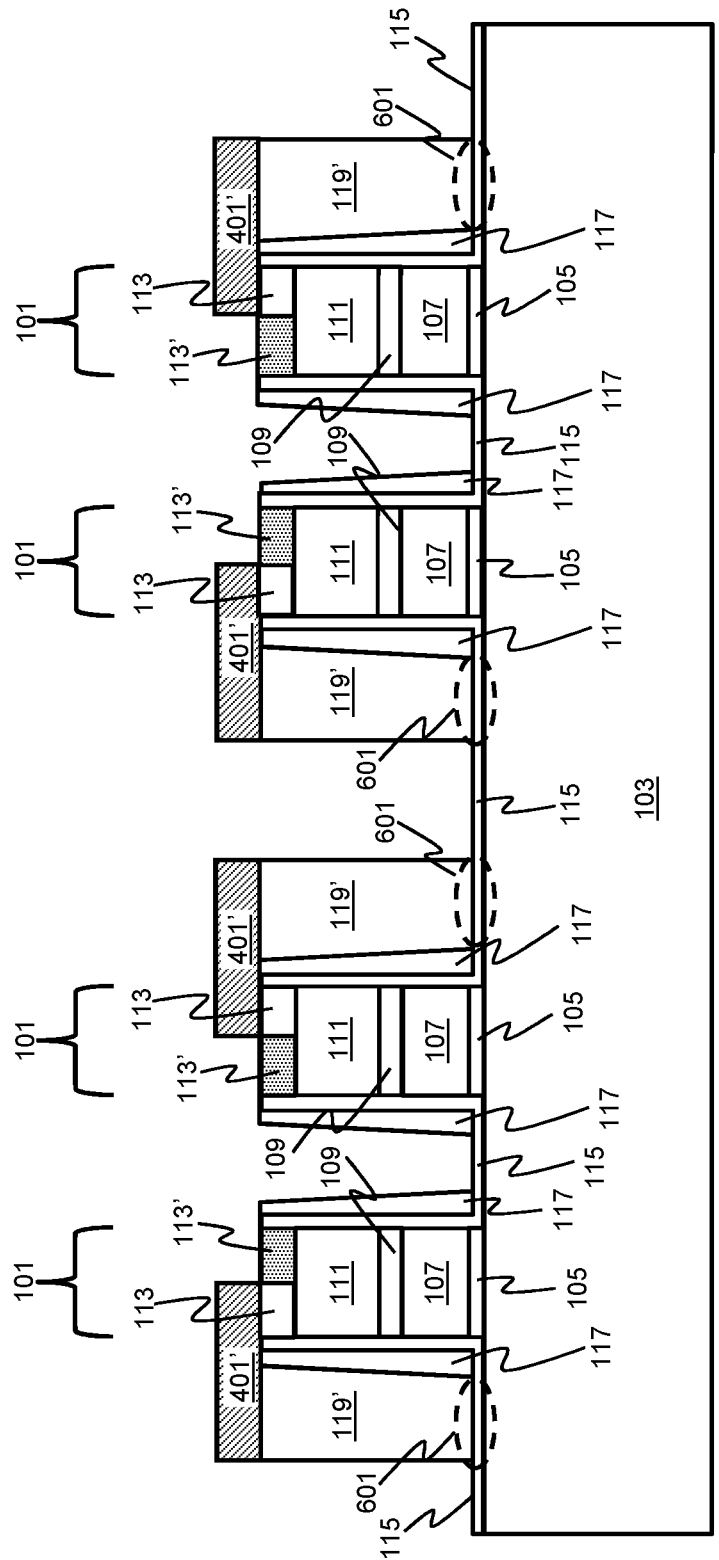

Next, patterning stacks 501 are formed, e.g., each to a width of 60 nm to 160 nm, over the dielectric blocking layer 401, each covering a portion of a memory stack 101, respectively, as depicted in FIG. 5. The dielectric blocking layer 401, optical planarization layer 201, and polysilicon layer 119 are then removed on opposite sides of the patterning stacks 501, forming the dielectric blocking layer 401' and defining each memory device 120, as depicted in FIG. 6.

During subsequent processing (not shown for illustrative convenience), the dielectric blocking layer 401' blocks implantation into the interpoly dielectric structure 117 between a memory device 120 and an adjacent memory stack 101, which improves interpoly dielectric breakdown. The dielectric blocking layer 401' also blocks implantation into the memory device 120, which improves memory device dielectric breakdown within the region 601 of the insulating layer 115. In addition, the dielectric blocking layer 401' ensures that a memory device 120 and an adjacent memory stack 101 have the same height, which provides a uniform electric field between the memory device 120 and the adjacent memory stack 101. Further, the dielectric blocking layer 401' blocks silicidation on the memory device 120 and prevents the subsequently formed silicide layer 113' (shown in FIG. 7) from forming across the entire width of the memory stack 101, thereby preventing shorts between a memory device 120 and an adjacent memory stack 101.

The embodiments of the present disclosure can achieve several technical effects including forming a cost effective highly reliable memory device with selective silicidation due to the interpoly dielectric breakdown improvement, the memory device short improvement, memory device dielectric breakdown improvement, and the improvement of electric field uniformity between a memory device and an adjacent memory stack. Embodiments of the present disclosure enjoy utility in various microcontroller applications as, for example, industrial (network, motor control, etc.), mobile phones, automotive electronics, chip cards, and consumer applications (gaming, camera, etc.). The present disclosure therefore enjoys industrial applicability in any of various types of semiconductor devices including NVM devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a memory stack on a substrate;
    forming a conformal insulating layer on sidewalls and on an upper surface of the memory stack and on an upper surface of the substrate;
    forming an interpoly dielectric adjacent to sidewalls of the insulating layer;
    forming a conformal polysilicon silicon layer over the insulating layer and interpoly dielectric structures;
    forming an optical planarization layer over the polysilicon layer;
    planarizing the optical planarization and polysilicon layers;
    forming a dielectric blocking layer over the memory stack and substrate;
    forming a patterning stack over the dielectric blocking layer, the patterning stack covering a portion of the memory stack; and
    removing the dielectric blocking, optical planarization, and polysilicon layers on opposite sides of the patterning stack.

2. The method according to claim 1, comprising forming the memory stack by:
    forming a first silicon oxide ($SiO_x$) layer over the substrate;
    forming a first polysilicon layer over the first $SiO_x$ layer;
    forming a dielectric layer over the first polysilicon layer;
    forming a second polysilicon layer over the dielectric layer; and
    forming a capping layer over the second polysilicon layer.

3. The method according to claim 2, comprising forming the dielectric layer of $SiO_x$ or a composite layer of $SiO_x$/silicon nitride (SiN)/$SiO_x$ or $SiO_x$/silicon oxynitride (SiON)/$SiO_x$.

4. The method according to claim 1, comprising forming the conformal insulating layer of $SiO_x$, SiN, or a composite layer of $SiO_x$/SiN/$SiO_x$ or $SiO_x$/SiN.

5. The method according to claim 1, comprising forming the interpoly dielectric of a layer of $SiO_x$, or a layer of SiN, or a composite layer of $SiO_x$/SiN/$SiO_x$ or a composite layer of $SiO_x$/polysilicon/$SiO_x$.

6. The method according to claim 1, comprising forming the dielectric blocking layer of SiN, or of $SiO_x$, or of SiON, or of a composite layer of a combination of any two or three of SiN, $SiO_x$, and SiON layers.

7. A method comprising:
    forming a pair of memory stacks laterally separated on a substrate;
    forming a conformal insulating layer on sidewalls and on an upper surface of each memory stack and on the substrate;
    forming an interpoly dielectric structure adjacent to each sidewall of the insulating layer;
    forming a conformal polysilicon silicon layer over the substrate;
    forming an optical planarization layer over the polysilicon layer;
    planarizing the optical planarization and polysilicon layers;
    forming a dielectric blocking layer with a thickness of 50 angstrom (Å) to 1500 Å over the substrate;
    forming a pair of patterning stacks laterally separated on the dielectric blocking layer, each patterning stack covering an outer portion of a memory stack; and
    removing the dielectric blocking, optical planarization, and polysilicon layers on opposite sides of each patterning stack.

8. The method according to claim 7, comprising forming each memory stack by:
    forming a first silicon oxide ($SiO_x$) layer over the substrate;
    forming a first polysilicon layer over the first $SiO_x$ layer;
    forming a dielectric layer over the first polysilicon layer;
    forming a second polysilicon layer over the dielectric layer; and
    forming a capping layer over the second polysilicon layer.

9. The method according to claim 7, comprising forming the conformal insulating layer of $SiO_x$, SiN, or a composite layer of $SiO_x$/SiN/$SiO_x$ or SiOx/SiN.

10. The method according to claim 7, comprising forming the interpoly dielectric of a layer of $SiO_x$, or a layer of SiN, or a composite layer of $SiO_x$/SiN/$SiO_x$ or a composite layer of $SiO_x$/polysilicon/$SiO_x$.

11. The method according to claim 1, comprising forming the dielectric blocking layer of SiN, or of $SiO_x$, or of SiON, or of a composite layer of a combination of any two or three of SiN, $SiO_x$, and SiON layers.

* * * * *